United States Patent [19]
Lee

[11] Patent Number: 5,932,378
[45] Date of Patent: Aug. 3, 1999

[54] PHASE SHIFTING PHOTOMASK FABRICATION METHOD

[75] Inventor: Jun Seok Lee, Seoul, Rep. of Korea

[73] Assignee: LG Semicon Co., Ltd., Choonegcheongbuk-Do, Rep. of Korea

[21] Appl. No.: 09/041,600

[22] Filed: Mar. 13, 1998

[30] Foreign Application Priority Data

Jun. 24, 1997 [KR] Rep. of Korea ............... 97-26697

[51] Int. Cl.⁶ .................................................. G03F 9/00
[52] U.S. Cl. .................................................. 430/5
[58] Field of Search ..................... 430/5, 311, 314, 430/322, 323

[56] References Cited

U.S. PATENT DOCUMENTS

| 5,302,477 | 4/1994 | Dao et al. | 430/5 |
| 5,455,131 | 10/1995 | Kang et al. | 430/5 |
| 5,484,672 | 1/1996 | Bajuk et al. | 430/5 |

Primary Examiner—S. Rosasco
Attorney, Agent, or Firm—Morgan, Lewis & Bokius LLP

[57] ABSTRACT

A phase shifting photomask fabrication method includes the steps of forming a recess in an upper surface of a transparent substrate having a depth sufficient to shift a phase of light, forming an opaque layer on the transparent substrate including the recess, forming a first patterning layer having a plurality of openings on the opaque layer, forming a plurality of side wall spacers on each side wall of the first patterning layer, etching the opaque layer by using the side wall spacers and exposing the transparent substrate, forming a second patterning layer on the exposed transparent substrate exposing a portion of the transparent substrate by selectively etching portions covered by the first patterning layer and the opaque layer, etching the exposed transparent substrate to a depth sufficient to effect a phase shift, and removing the side wall spacers and the second patterning layer. This method eliminates a micro loading effect by separately forming a wider main opening pattern unit and a narrower sub-opening pattern unit, and accurately controls the phase shift, improving reliability of the photomask.

28 Claims, 12 Drawing Sheets

PHASE SHIFTING PHOTOMASK FABRICATION METHOD

This application claims the benefit of Korean Patent Application No. 97-26697, filed Jun. 24, 1997, which is hereby incorporated by reference.

BACKGROUND OF THE INVENTION

1. Field of the Invention

The present invention relates to a photomask fabrication method for a semiconductor device, and, more particularly, to an improved phase shifting photomask fabrication method for fabricating a rim type and an out-rigger type photomask.

2. Description of the Related Art

A known lithographic process employs a photomask having a transparent portion for passing light and an opaque portion for blocking light in order to form a pattern on a wafer by irradiating the light onto a ready-made imprint pattern. Accordingly, a variety of such photomasks exhibiting a light phase difference have been disclosed in recent years.

An SPIE concept of a phase shifting photomask was initially disclosed by M. D. Levenson of IBM in 1982, and a variety of so called "Levenson" phase shifting photomasks have been described since.

A phase shifting photomask shifts by 180° the phase of light passing through a light shifter relative to light passing through a transparent portion (other than the light shifter), in order to improve resolution and focus depth of a photolithographic apparatus. Such a phase shifting photomask may be an alternating type, an attenuating type, a rim type, an out-rigger type, or the like.

A conventional phase shifting photomask of the rim type and the out-rigger type will now be described.

Referring to a rim type phase shifting photomask as shown in FIG. 1A, an opaque layer 11 and a light shifter 12 are formed on a transparent photomask substrate 10. Inside the light shifter 12 there is an opening pattern 13, which is not imprinted by the light.

FIG. 1B, which is a composite view, shows a cross-sectional view taken along line IB—IB in FIG. 1A, a graph illustrating light intensity when the light that passed through the light shifter 12 and the opening pattern 13 impinges on a wafer 20, and a cross-sectional view of a patterned photoresist film 18 formed on a wafer 20.

The light passing through the photomask substrate 10 goes through the opening pattern 13 and is phase-shifted while passing through the light shifter 12. No light passes through the opaque layer 11. The intensity of the light that passed through the opening pattern 13 is much higher than the intensity of light that passed through the light shifter 12, which is a narrow strip.

When the light reaches the photoresist film 18 formed on the wafer 20, a portion of the photoresist film 18 below the opening pattern 13 is exposed and may be removed for a positive photoresist, forming a corresponding opening 23 on the wafer 20.

As shown in FIG. 2A, the transparent photomask substrate 10 has a pattern that includes an opaque layer 11, a pair of phase shifters 12, and a pair of opening patterns 13. The edges of the pair of phase shifters 12 are abutted or adjacent to each other. Here, because the pair of phase shifters 12 have light phases identical to each other, the light intensity on a portion of the photoresist layer 18 between openings 23 is higher due to a light combination effect. The intensity of the light that passed through the photomask substrate 10 is shown in FIG. 2B. The light with a relatively high intensity passes through the marginal portion of each of the abutted phase shifters 12, so that the intensity of the light that passed through the photomask 10 produces a graphic image as shown in FIG. 2B. The photoresist film 18 just below the opening pattern 13 is exposed and may be removed entirely, forming the openings 23. At the same time, the photoresist film 18 between the openings 23 is partially removed, forming a depression 22, which is disadvantageously formed in a central portion of the photoresist film 18 between the openings 23.

In order to overcome such a disadvantage, a phase shifting photomask for shifting a light phase between the opening patterns 13 in the mask is disclosed in U.S. Pat. No. 5,302,477, a plan view of which is shown in FIG. 3A.

A pair of opening patterns 33 and 36 serving as a transmissive region are formed on a transparent quartz substrate 20. A pair of light shifters 32 and 35 are formed surrounding the opening patterns 33 and 36. A chromium layer 21 serving as an opaque layer is formed on the transparent substrate 20 except for the opening patterns 33 and 36 and the light shifters 32 and 35. The pair of opening patterns 33 and 36 pass the light through and have a phase difference of 180° relative to each other. The light shifters 32 and 35 surrounding the corresponding opening patterns 33 and 36 also have a phase difference of 180° relative to each other. The light that passed through such a rim type phase inverting photomask is illustrated as a light intensity graph in FIG. 3B, wherein the neighboring light shifters 32 and 35 are offset from each other in phase, reducing the light intensity. When light having an intensity profile shown in FIG. 3B irradiates a photoresist film (not shown), an undesirable opening may be formed in the photoresist film.

FIG. 3C is a cross-sectional view taken along line IIIC—IIIC of a rim type phase inverting photomask. As described above, the phases of the opening pattern 33 and the phase shifter 32 are inverted relative to each other, the phases of the phase shifter 32 and the phase shifter 35 are inverted relative to each other, and the respective phases of the phase shifter 35 and the opening pattern 36 are inverted relative to each other. Such phase inversions depend on a thickness of the photomask substrate 20, so that the light shifter 32 and the opening pattern 33 have level differences in thickness, the light shifter 32 and the light shifter 35 have level differences in thickness, and the light shifter 35 and the opening pattern 36 have level differences with each other in thickness. In other words, the depth of the etch for the light shifter 35 is the same as the depth of the etch for the opening pattern 33.

The fabrication method of a conventional phase shifting photomask shown in FIG. 3C will now be described. First, as shown in FIG. 4A, a patterned layer 110 is formed on a patterned chromium layer 21, which is itself formed on a quartz substrate 20, in order to obtain a plurality of openings 111 formed through the layers 110 and the chromium layer 21.

As further shown in FIG. 4B, an undercut etching is carried out on the chromium layer 21 to form a plurality of chromium-eliminated regions 112, which will be employed as the phase shifters 32 and 35, as shown in FIG. 3A.

Referring to FIG. 4C, using the patterned layer 110 having the plurality of openings 111 as a mask, anisotropic etching is carried out to etch back the quartz substrate 20 to a depth sufficient to generate a phase shift. Such an etching process forms the opening patterns 33 and 36, as shown in FIG. 4C.

Then, a patterned layer 115 having an opening 116 is formed, as shown in FIG. 4D. The quartz substrate 20 is etched through the opening 116 to a depth sufficient to generate a phase shift of 160° to 200°, and preferably 180°. As a result, as shown in FIG. 4E, the pair of opening patterns 33 and 36 and the pair of light shifters 32 and 35 are formed having a depth sufficient to invert the incoming light phase. This is accomplished using photolithographic exposure and etching techniques well known in the art.

However, such a conventional phase shifting photomask fabrication process leads to several disadvantages in carrying out the undercut etching. For example, increased viscosity between the photoresist film and the chromium layer 21 causes an etchant solution to infiltrate between the chromium layer 21 and the resist film 115, thereby disadvantageously etching the chromium layer 21.

Another conventional phase shifting photomask fabrication process that does not utilize an undercut etching process is shown in FIGS. 5A–5D. As shown in FIG. 5A, a chromium layer 21 is formed on the quartz substrate 20. A patterned layer 51 having a plurality of openings 52 is formed on the chromium layer 21. Using the patterned layer 51 as a mask, the chromium layer 21 and a certain amount of the quartz substrate 20 underneath the chromium layer 21 are etched. The patterned layer 51 is then removed, as shown in FIG. 5B. The etching into the quartz substrate 20 is carried out to a depth sufficient to generate a phase shift.

An further shown in FIG. 5C, another patterned layer 61 having a plurality of openings 62 is formed on the structure of FIG. 5B. The exposed opaque layer 21 is selectively etched, and the patterned layer 61 is removed, completing the conventional phase shifting photomask having an opening pattern 33 and a light shifter 35 as shown in FIG. 5D. Here, the patterned layer 61 should be accurately position-aligned so as to obtain a light shifter 35 of a desired dimension. Also, if the patterned layer 61 is slanted to one side, mask resolution may be degraded due to a difference in width between the light shifters.

Such a conventional phase shifting photomask fabrication method requires extremely accurate alignment, often leading to difficulties in the process of fabrication. Further, when etching the opaque layer 21 in order to form the opening pattern 33 and the light shifter 35, because of differences in etching regions, the quartz substrate 20 having an opening pattern may be partially etched due to a micro loading effect, and a photomask having a desired phase shift will not be produced.

SUMMARY OF THE INVENTION

Accordingly, the present invention is directed to a phase shifting photomask fabrication method that substantially obviates one or more of the problems due to the limitations and disadvantages of the related art.

An object of the present invention is to provide a phase shifting photomask fabrication method that uses self-alignment to form side wall spacers when etching a main opening pattern and a sub-opening pattern for obtaining an accurate pattern thereof.

Another object of the present invention is to accurately control the phase shift by preventing a micro loading effect from occurring due to a separate formation of a wider main opening pattern unit and a narrower sub-opening pattern unit.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these an other advantages, and in accordance with the purpose of the present invention, as embodied and broadly described, in a first aspect of the present invention there is provided a phase shifting photomask fabrication method including the steps of forming a recess in a substrate, forming an opaque layer on the substrate and the recess, forming a protection layer having openings on the opaque layer, etching the opaque layer through the openings, forming side wall spacers on each side wall of the opaque layer and the protection layer, etching the substrate to a predetermined depth by using the side wall spacers as a mask, removing the side wall spacers; and removing the protection layer.

In a second aspect of the present invention, there is provided a phase shifting photomask fabrication method including the steps of forming a recess in a substrate, forming an opaque layer on the substrate and the recess, forming a first photoresist layer having openings, forming side wall spacers on side walls of the first photoresist layer, etching the opaque layer by using the side wall spacers as a mask to expose an exposed portion of the substrate, forming a second photoresist layer on the exposed portion of the transparent substrate, the first photoresist layer, and the side wall spacers, removing portions of the second photoresist layer not covering the exposed portion of the substrate, removing the first photoresist layer and selected portions of the opaque layer, etching selected portions of the transparent substrate to a depth sufficient to carry out a phase shift; and removing the side wall spacers and the second photoresist layer.

In a third aspect of the present invention, there is provided a method of forming a phase shifting photomask including the steps of forming a recess in a substrate, depositing an opaque layer, depositing a first photoresist layer, patterning the first photoresist layer to form openings in the first photoresist layer, removing portions of the opaque layer below the openings in the first photoresist layer, depositing a second photoresist layer, etching the second photoresist layer to form side wall spacers, etching the substrate to a depth sufficient to generate a phase shift, and removing the side wall spacers and the second photoresist layer.

In a fourth aspect of the present invention, there is provided a method of forming a phase shifting photomask including the steps of forming recesses in a substrate, depositing an opaque layer, depositing a first photoresist layer, forming openings in the first photoresist layer, forming side wall spacers on side walls of the first photoresist layer, forming openings in the opaque layer, depositing a second photoresist layer, removing the second photoresist layer except for portions of the second photoresist layer covering the openings in the opaque layer, removing the first photoresist layer and selected portions of the opaque layer, etching the substrate to form sub-opening patterns, and removing the second photoresist layer and the side wall spacers.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1A:
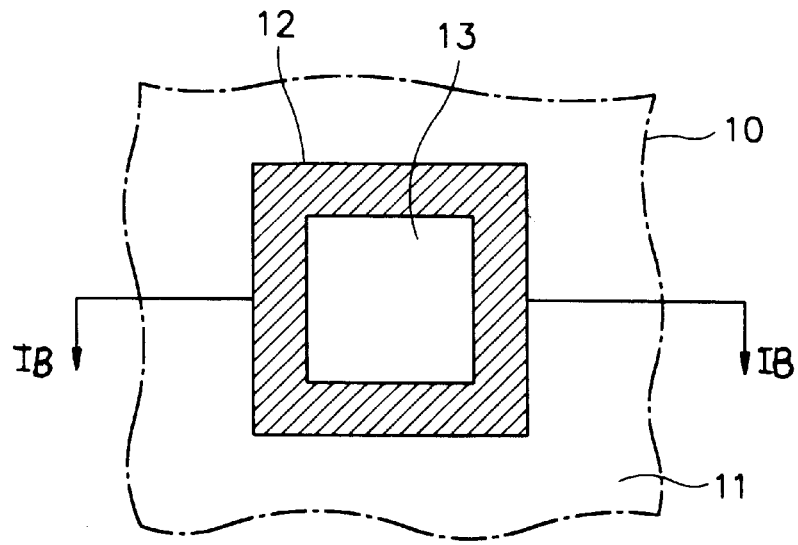
FIG. 1A is a plan view of a first conventional rim type phase shifting photomask for a semiconductor device.
Figure 1B:
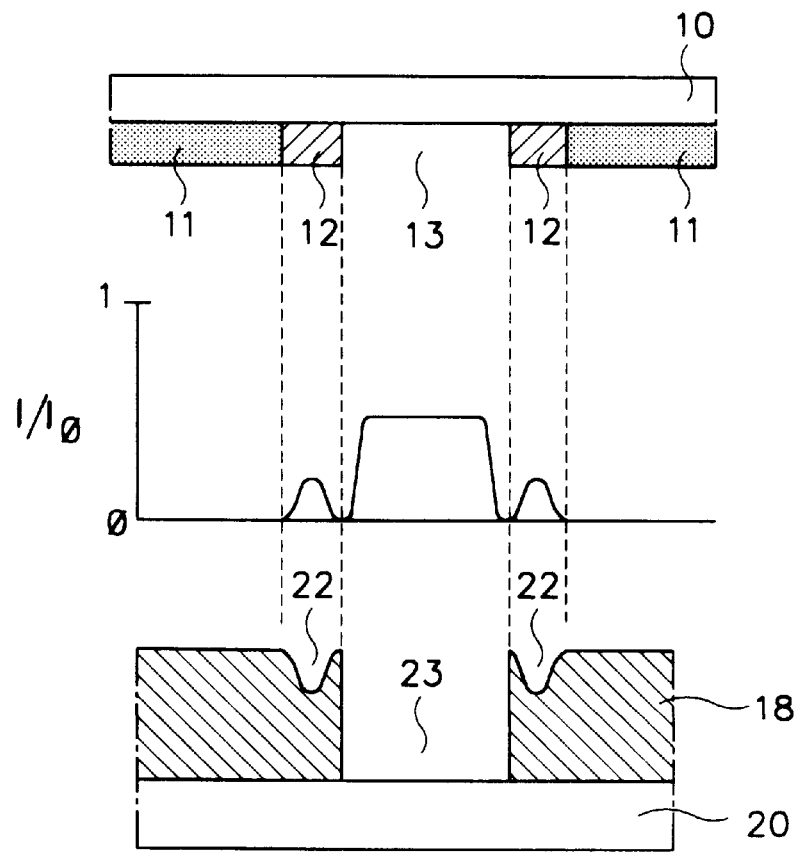
FIG. 1B is a compound view including a cross-sectional view taken along line IB—IB in FIG. 1A, a graph of the intensity of the light that irradiated a wafer, and a cross-sectional view of a photoresist film formed on the wafer after irradiation by the light through the photomask.
Figure 2A:
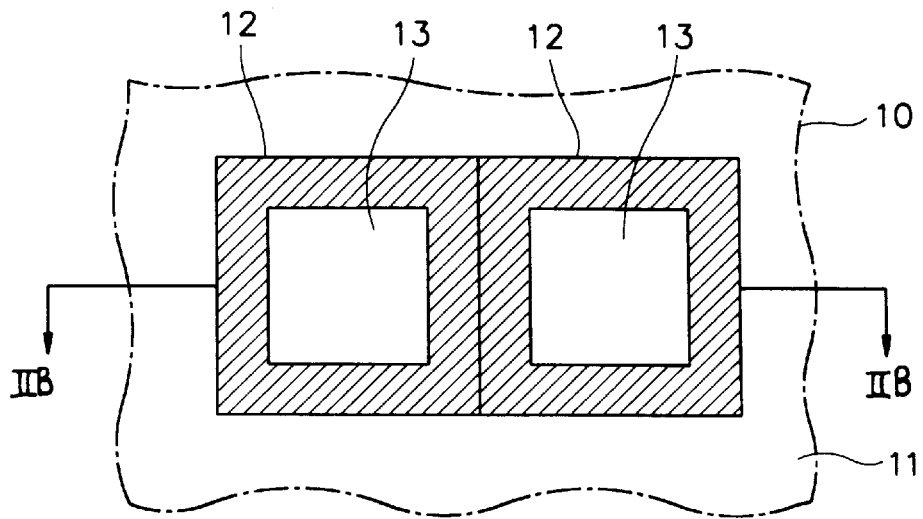
FIG. 2A is a plan view of a second conventional rim type phase shifting photomask for a semiconductor device.
Figure 2B:
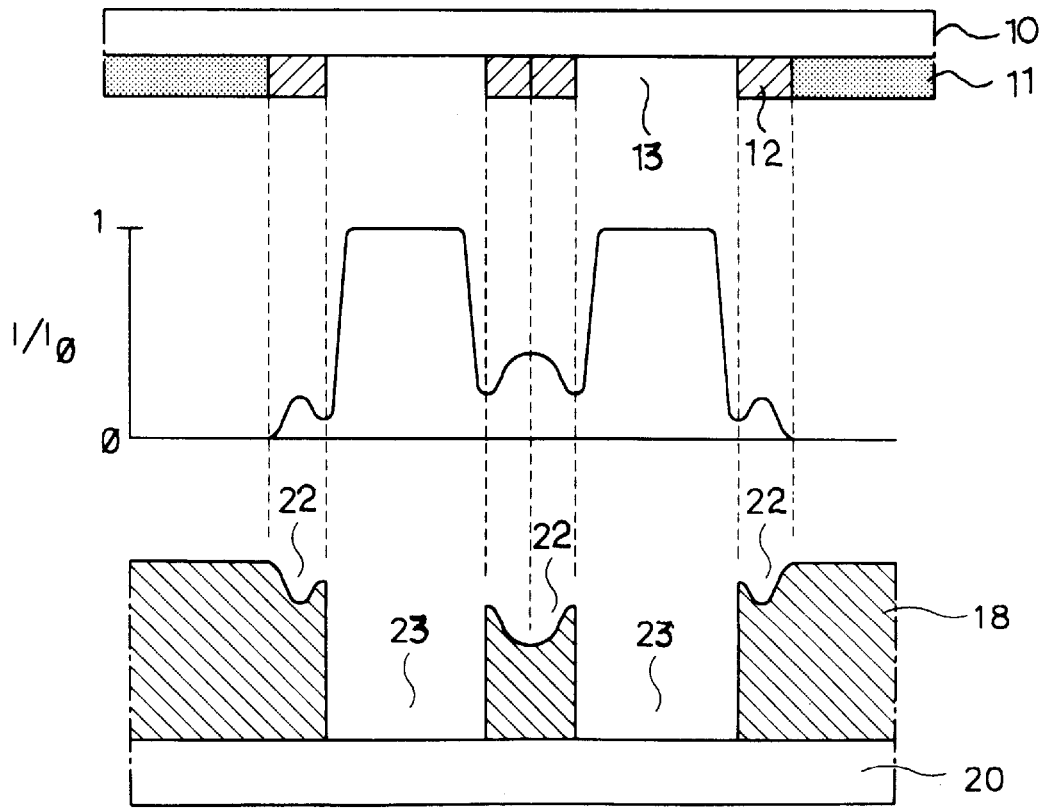
FIG. 2B is a compound view including a cross-sectional view taken along line IIB—IIB in FIG. 2A, a graph of the intensity of the light that irradiated a wafer, and a cross-sectional view of a photoresist film formed on the wafer after irradiation by the light through the photomask.
Figure 3A:
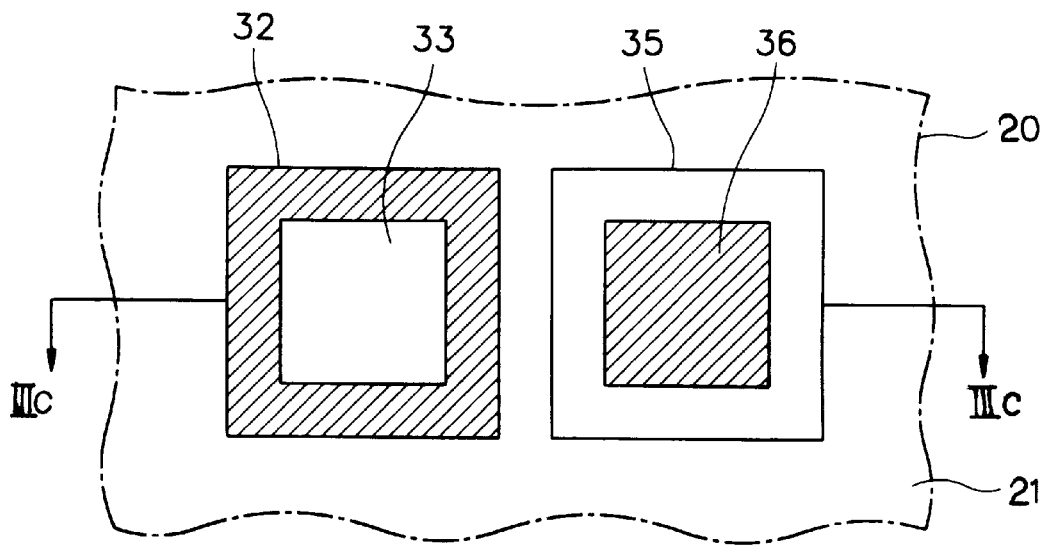
FIG. 3A is a plan view of an inverter rim type phase shifting photomask according to conventional art.
Figure 3B:
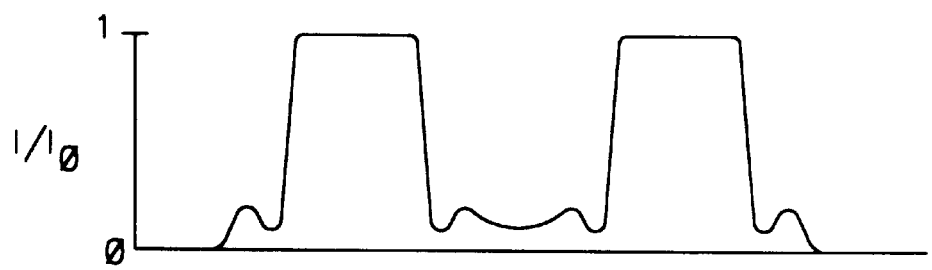
FIG. 3B is a graph illustrating the intensity of the light passing through the photomask of FIG. 3A.
Figure 3C:
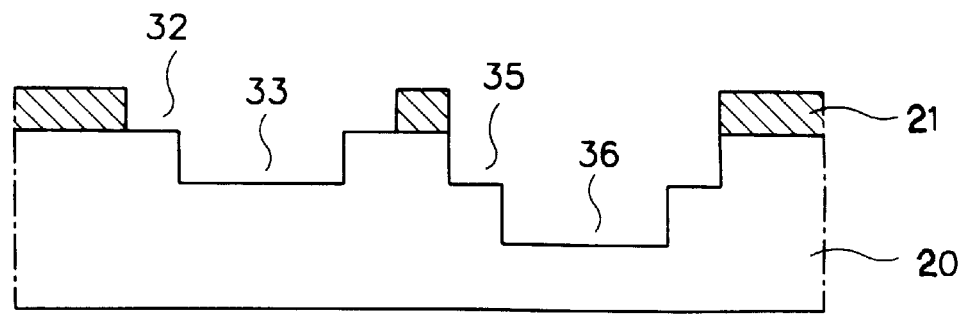
FIG. 3C is a cross-sectional view taken along line IIIC—IIIC in FIG. 3A.
Figure 4A:
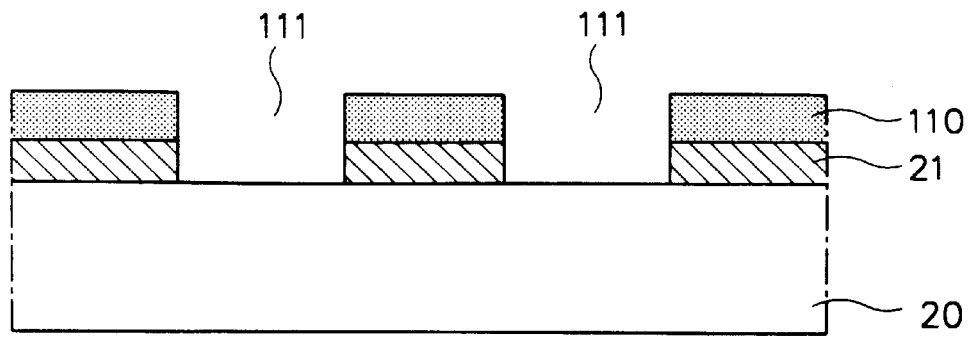
FIGS. 4A–4E are process views of a conventional inverted rim type phase shifting photomask.
Figure 4B:
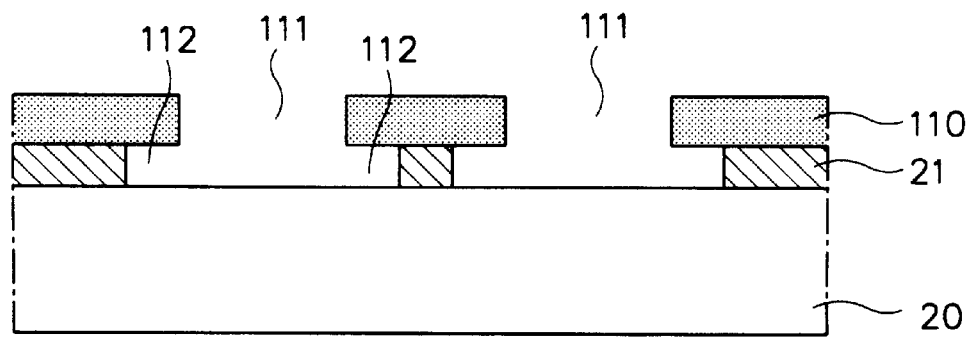
Figure 4C:
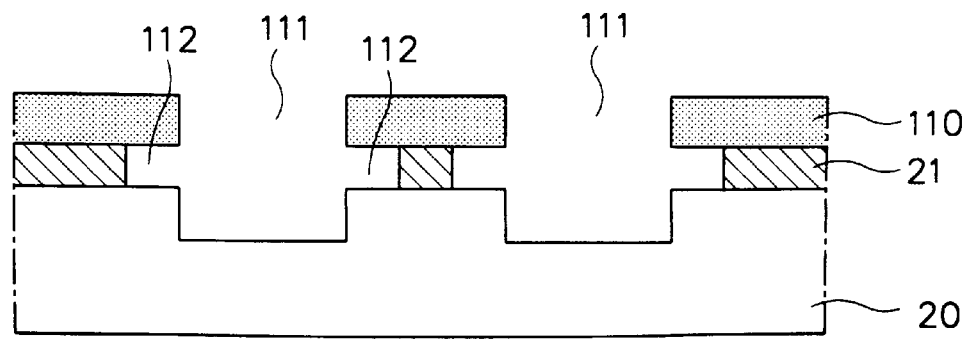
Figure 4D:
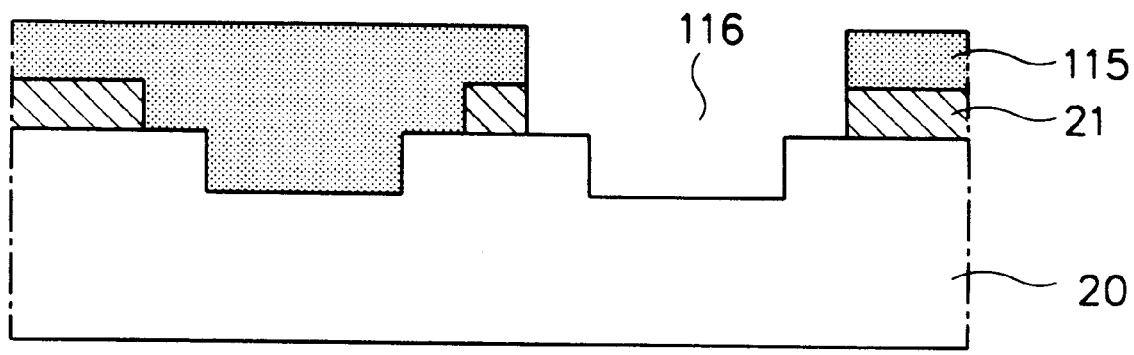
Figure 4E:
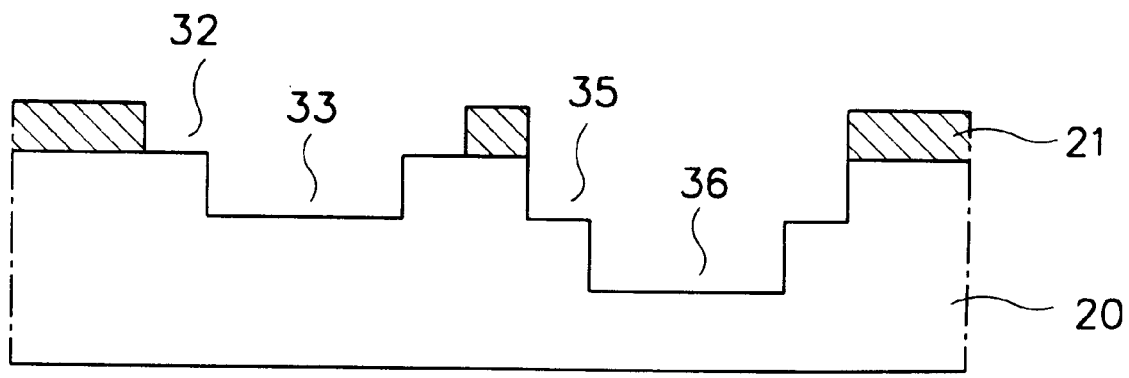
Figure 5A:
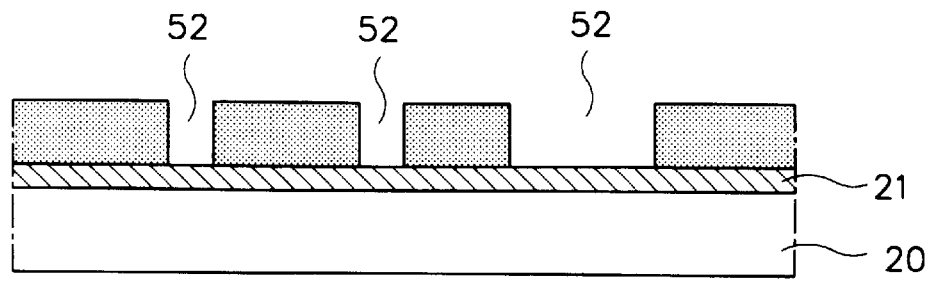
FIGS. 5A–5D illustrate the steps of another process for forming a conventional inverted rim type phase shifting photomask.
Figure 5B:
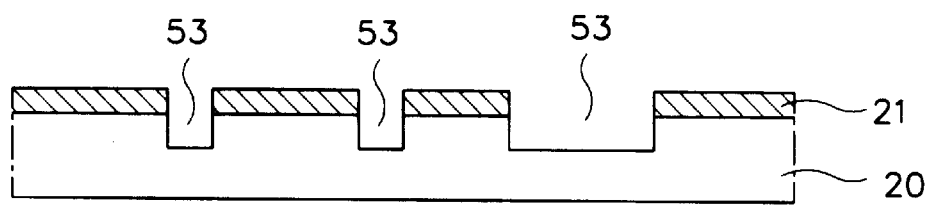
Figure 5C:
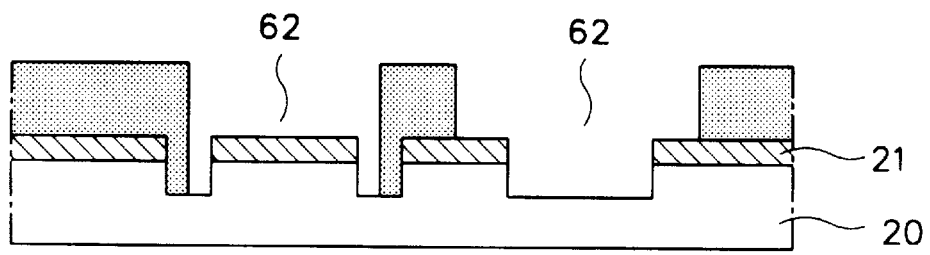
Figure 5D:
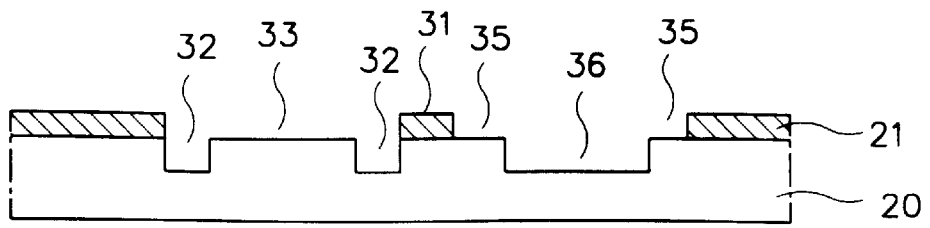
Figure 6A:
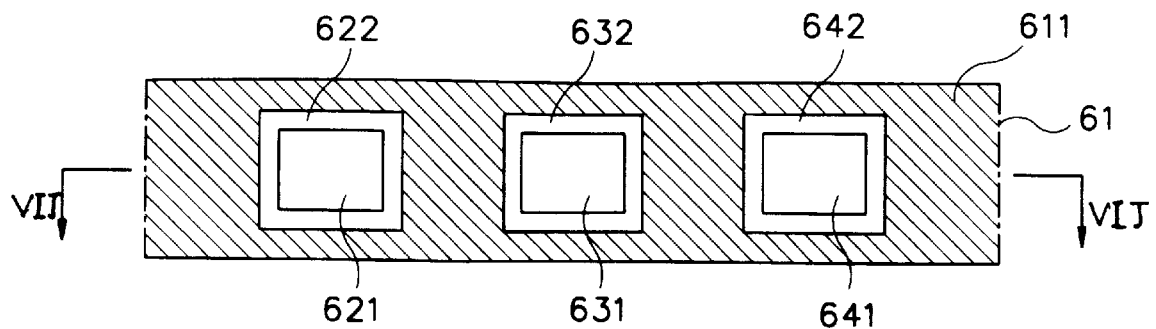
FIG. 6A is a plan view of an inverted rim type phase shifting photomask according to a first embodiment of the present invention.

FIG. 6A is a plan view of an inverted rim type phase shifting photomask according to the present invention, wherein reference numeral 61 denotes a transparent photomask, reference numeral 611 denotes an opaque layer, reference numerals 621, 631, 641 denote opening patterns, and reference numerals 622, 632, 642 denote phase shifting rims. Here, neighboring patterns have opposite phases relative to each other, and the difference between the phases is determined by the thickness of the transparent photomask.

The fabrication steps of the phase shifting photomask will now be described with reference to FIGS. 6B–6J illustrating cross-sectional process views along a line VIJ—VIJ of FIG. 6A.

Figure 6B:
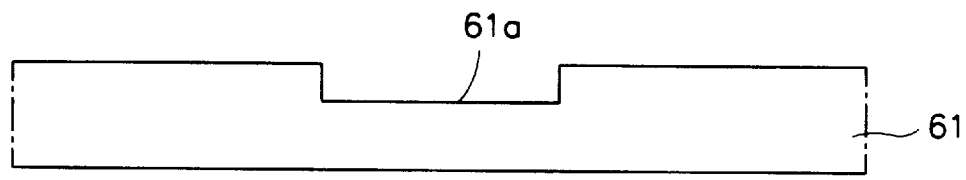
FIGS. 6B–6J illustrate the steps of a process for forming a phase shifting photomask according to a first embodiment of the present invention.

First, as shown in FIG. 6B, a portion of the transparent quartz substrate 61 is etched to a depth sufficient to invert a light phase, forming a recess 61a that will become an opening pattern 631. The opening pattern 631 is phase-inverted in comparison to a pair of opening patterns 621, 641 which will be formed later.

Thus, initially the opening patterns 621, 631, 641 have phase inversions relative to each other.

Figure 6C:
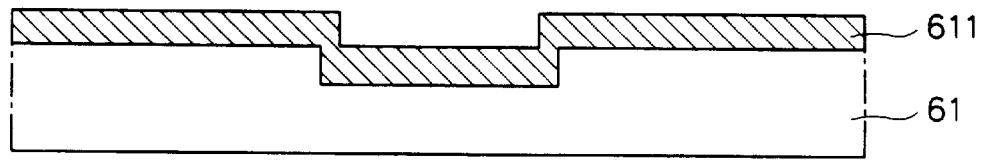
Figure 6D:
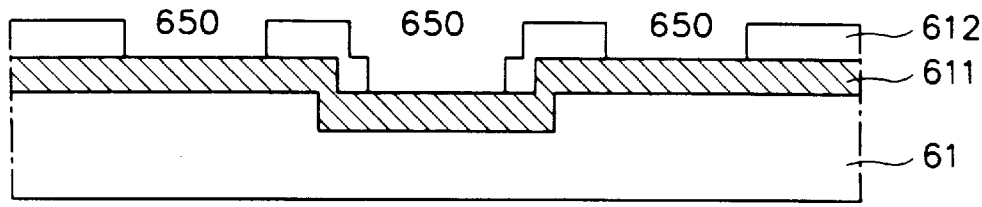

Referring to FIG. 6C, a chromium layer 611 serving as an opaque layer is deposited on the quartz substrate 61 including the recess 61a. Then, as shown in FIG. 6D, an inorganic Ge—Se family photoresist film 612 having a layer including an Ag compound is formed on the chromium layer 611. The photoresist film 612 is patterned to have a plurality of openings 650 having a width obtained by adding up the opening pattern 621 and the light shifting rim 622, the opening pattern 631 and the light shifting rim 632, or the opening pattern 641 and the light shifting rim 642.

Referring to the patterning process of the photoresist film 612, the photoresist film 612 (other than a portion for forming the openings 650) is exposed to the light. Around the portion of the photoresist film 612 exposed to the light, an Ag component of $AgNO_3$ formed in the upper portion of the photoresist film 612 defuses into the photoresist film 612, so that after the Ag diffusion, and when the photoresist film is developed using an alkaline solution, the photoresist film portion that did not have the Ag diffusion (i.e. where the light was not imprinted) is removed, forming the openings 650.

The inorganic photoresist film 612 is used to obtain a clear pattern without generating a standing wave effect that occurs when using an organic photoresist. The standing wave effect refers to a condition where, when the light is imprinted, and the photoresist film is developed, a side portion of the remaining photoresist film becomes crooked, forming an unclean pattern.

Figure 6E:
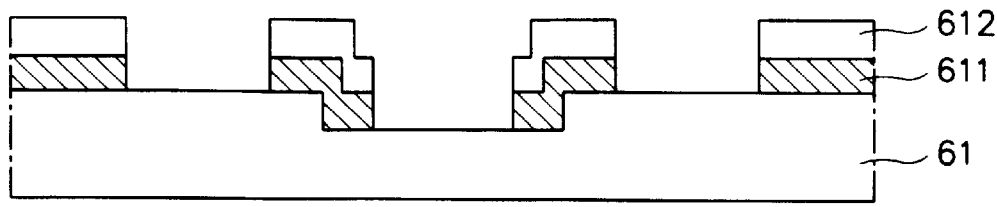

As shown in FIG. 6E, the chromium layer 611 is etched through the openings 650, exposing the quartz substrate 61. The exposed portions of the quartz substrate 61 correspond to opening patterns and phase shifting rims.

Figure 6F:
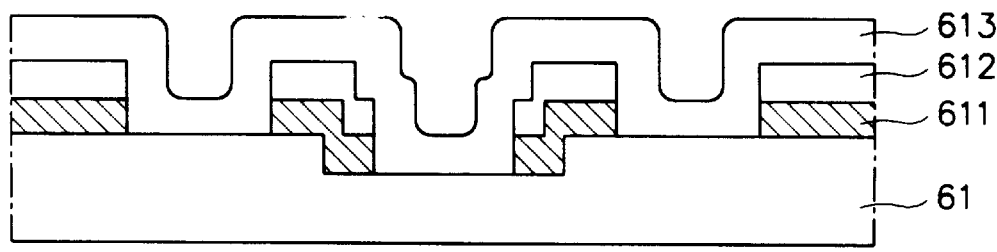
Figure 6G:
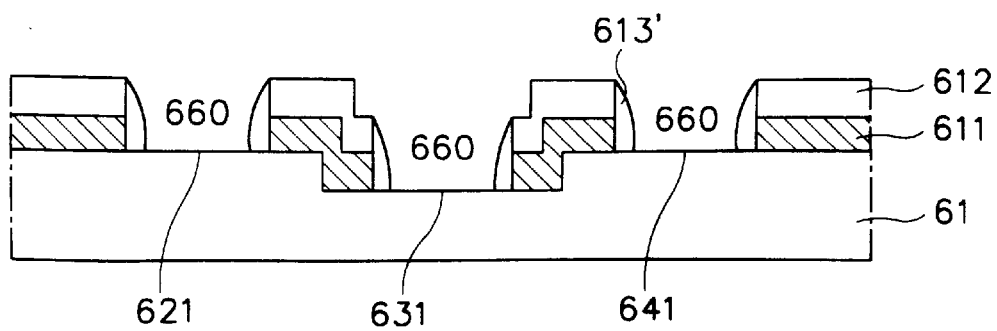

A polymer layer 613 is formed over the entire structure, as shown in FIG. 6F. The polymer layer 613 is etched back, forming side wall spacers 613' on respective side walls of the inorganic photoresist film 612 and the chromium layer 611. A polymer is used for forming the sidewall spacers 613' because of easy handling, non-toxicity, and easy removability.

The abutting length between each of the side wall spacers 613') and the quartz substrate 61 (i.e. in the left-to-right direction of FIG. 6G) is identical to a corresponding width of the phase shifting rims 622, 632, 642.

Figure 6H:
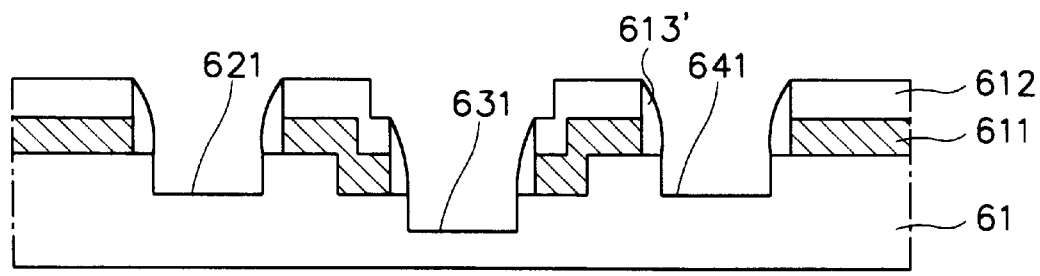

Then, as shown in FIG. 6H, using the inorganic photoresist pattern 612 and the side wall spacers 613' as a mask, the quartz substrate 61 is etched to a depth sufficient to generate an appropriate phase shift to define the phases of the opening patterns 621, 631, 641. At this time, similar areas of the opening patterns 621, 631, 641 are etched in order to prevent a micro loading effect from occurring, as well as to invert the light phase to a desired extent depending on the depth of etching.

Figure 6I:
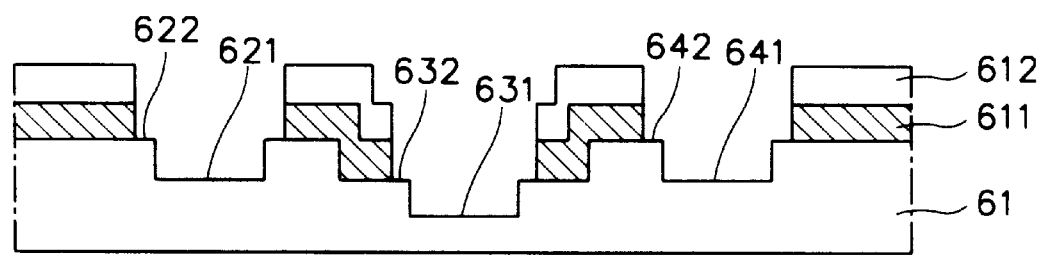

With reference to FIG. 6I, the side wall spacers 613' are removed, and the removed regions become phase shifting rims 622, 632, 642.

Therefore, unlike to conventional art that requires position alignment after forming a second photoresist film layer, the present invention allows for fabrication of the phase shifting rims by simply removing the side wall spacers 613', thus forming phase shifting rims without a risk of producing faulty masks caused by an inaccurate position alignment.

Figure 6J:
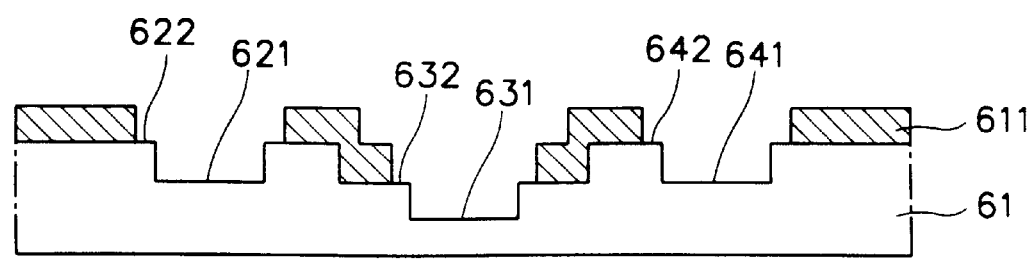

As shown in FIG. 6J, the inverted rim type phase shifting photomask fabrication is completed by removing the remaining photoresist film 612 on the opaque layer 611.

Figure 7A:
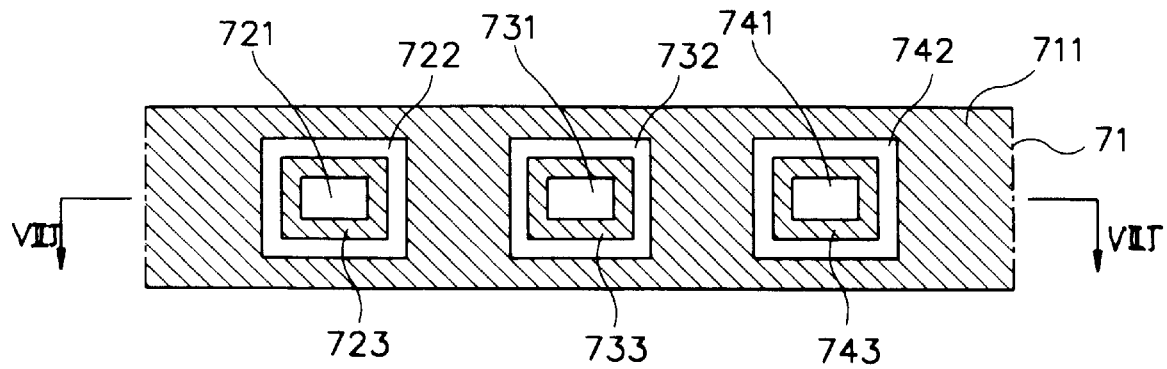
FIG. 7A is a plan view of an invention out rigger type phase shifting photomask according to a second embodiment of the present invention.

A second embodiment of the present invention provides an out rigger type phase shifting photomask fabrication method. FIG. 7A is a plan view of such an out rigger type phase shifting photomask according to the second embodiment of the present invention. As shown in FIG. 7A, a quartz substrate 71 has a plurality of main opening patterns 721, 731, 741, around which a plurality of corresponding chromium layer rims 723, 733, 743 are formed, which are in turn surrounded by a plurality of corresponding sub-opening patterns 722, 732, 742. A chromium layer 711 is formed on the quartz substrate 71, serving as an opaque layer, although no chromium layer is formed on the plurality of main opening patterns 721, 731, 741, the plurality of sub-opening patterns 722, 732, 742, and the plurality of chromium layer rims 723, 733, 743. The phase of light passing through the main opening pattern 721 is zero degrees, the phase of light passing through the sub-opening pattern 722 is 180°, and the phase of light passing through the neighboring sub-opening pattern 732 has a difference of 180° from that of the sub-opening pattern 722, i.e. 360° or zero degrees. Therefore, neighboring patterns have a phase difference of 180° relative to each other. That is, the phase of the sub-opening pattern 742 is 180° and the phase of the main opening pattern 741 is zero degrees. Consequently, by forming the neighboring patterns with opposite phases, such as opening patterns 721, 731 and 741, the light that passes through is offset 180° relative to the neighboring opening pattern, preventing patterns from being formed on undesired portions.

The fabrication method of the above out rigger type phase shifting photomask will now be described.

Figure 7B:
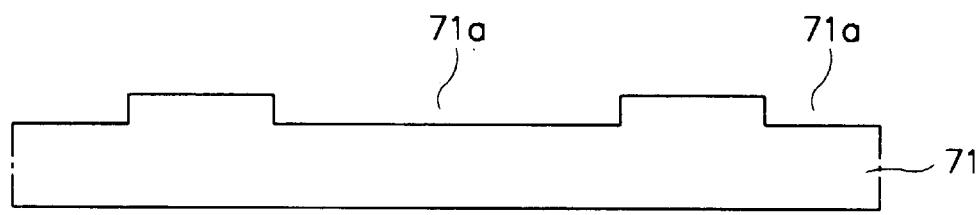
FIGS. 7B–7J illustrate the steps of a process for forming a phase shifting photomask according to a second embodiment of the present invention.
Figure 7C:
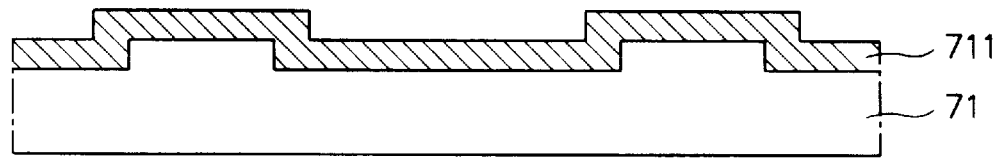
Figure 7D:
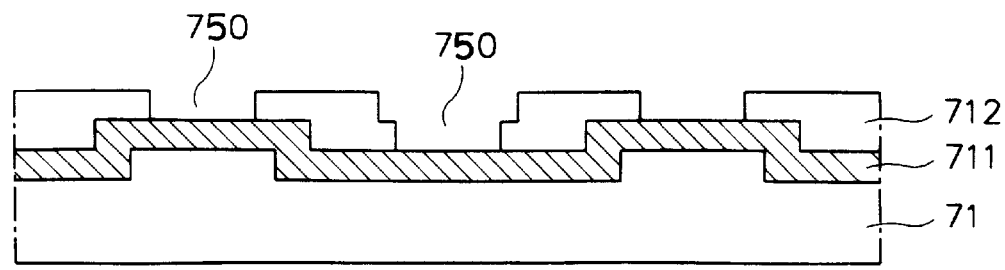
Figure 7E:
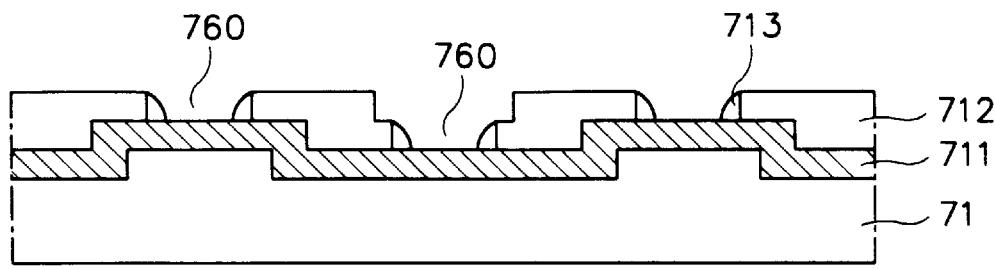
Figure 7F:
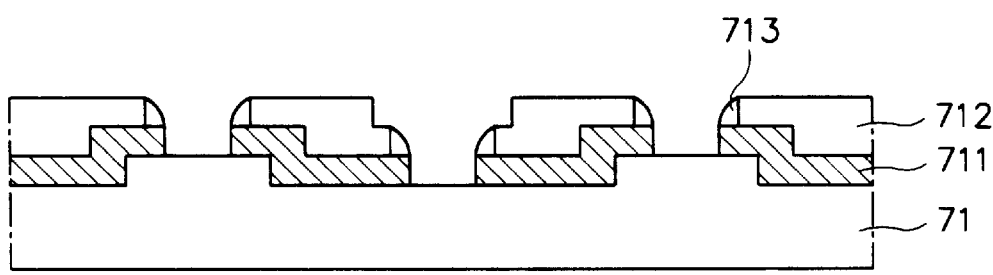

FIGS. 7B–7J are cross-sectional process views taken along line VIIJ—VIIJ in FIG. 7A. First, as shown in FIG. 7B, recesses 71a are formed in the upper surface of the quartz substrate 71. An opaque layer 711 made of chromium is formed on the upper surface of the quartz substrate 71 including the recesses 71a. An inorganic photoresist film 712 is formed on the opaque layer 711, and a plurality of openings 750 are formed by light-imprinting the inorganic photoresist film 712. The width of the openings 750 is identical to a value obtained by summing widths of the main opening patterns 721, 731, 741 and the chromium rims 723, 733, 743 surrounding the corresponding main opening patterns 721, 731, 741. Then, as shown in FIG. 7E, a side wall spacer 713 is formed on each side wall of the inorganic photoresist film pattern 712. Here, the width of each of the side wall spacers 713 abutting the opaque layer 711 is identical to that of the corresponding chromium rims 723, 733, 743 surrounding the corresponding main opening patterns 721, 731, 741. The width of the opening 760 corresponds to that of each of the main opening patterns 721, 731, 741. Using the photoresist film 712 and the side wall spacers 713 as a mask, the opaque layer 711 is etched, forming the main opening patterns 721, 731, 741.

Figure 7G:
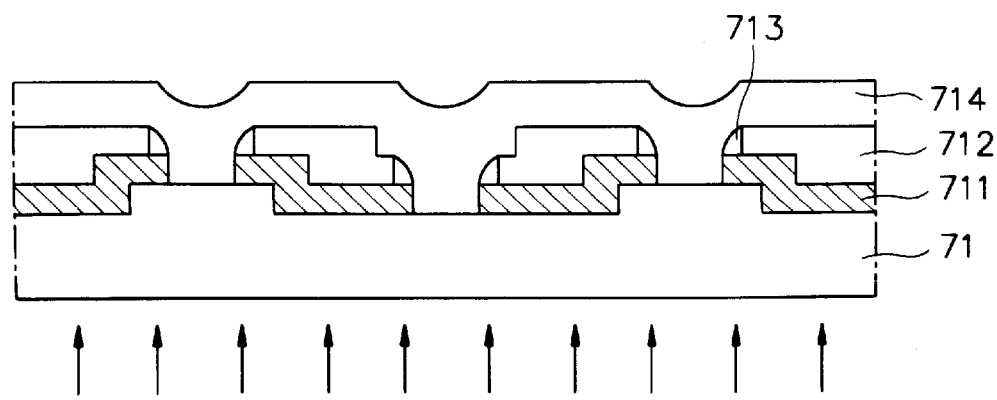
Figure 7H:
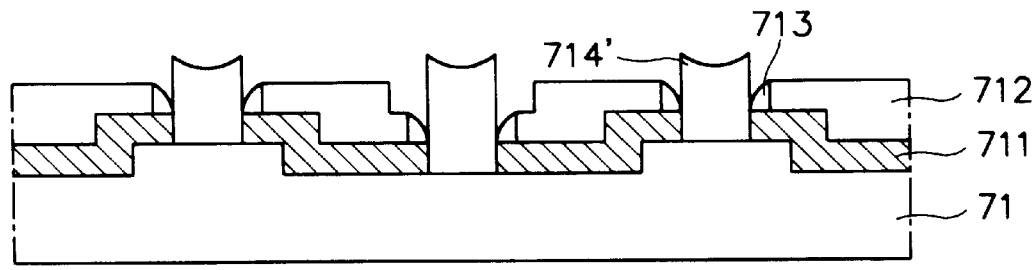

As further shown in FIG. 7G, a negative photoresist film 714 is formed over the entire structure. The quartz substrate 71 is irradiated by light from under and through the quartz substrate 71 in order to obtain a negative photoresist film pattern 714 formed only on a portion of the quartz substrate 71 not covered by the opaque layer 711. A portion of the opaque layer 711 provided with the inorganic photoresist film 712 is selectively and anisotropically etched to remove the photoresist film 712 and a portion of the opaque layer 711.

Figure 7I:
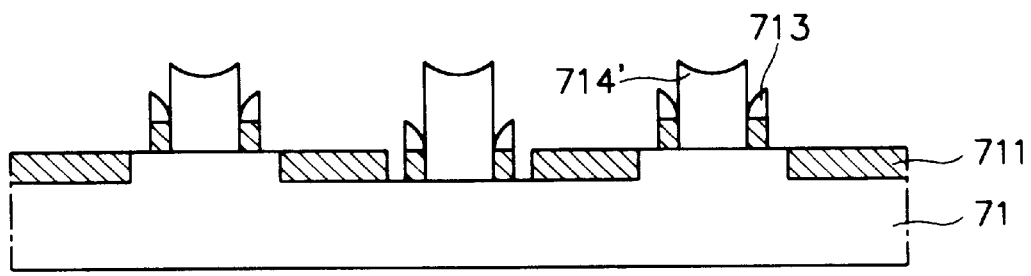

FIG. 7I is a cross-sectional view illustrating a surface structure of the quartz substrate 71 obtained by such a selective anisotropic etching process, wherein the exposed quartz substrate 71 is incorporated into the sub-opening patterns 722, 732, 742 corresponding to the main opening patterns 721, 731, 741 respectively. In FIG. 7I, the sub-opening pattern 722 and the main opening pattern 721 have the same phase, the sub-opening pattern 732 and the main opening pattern 731 have the same phase, and the sub-opening pattern 742 and the main opening pattern 741 have the same phase.

Figure 7J:
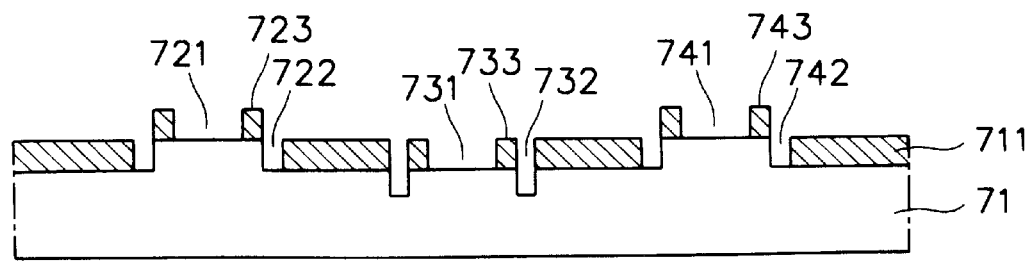

In order to invert the respective phases of the main opening patterns 721, 731, 742 and the sub-opening patterns 722, 732, 742, the exposed quartz substrate 71 is etched to a depth sufficient to effect a phase shift. Then, the side wall spacers 713 and the negative photoresist film 714 are removed, completing the out rigger type phase shifting photomask as shown in FIG. 7J. The main opening patterns 721, 731, 741 having wide widths as described above are simultaneously formed, and the sub-opening patterns 722, 732, 742 are also simultaneously formed, overcoming a dependence of the phase shift on the micro loading effect.

As described above, the phase shifting photomask fabrication method of to the present invention eliminates the micro loading effect by separately forming a wider main opening pattern and a narrower sub-opening pattern, and accurately controls the amount of phase shift, improving the reliability of the photomask.

Further, during the formation of the main opening patterns and the sub-opening patterns, position alignment is accomplished using self-alignment, enhancing productivity due to the simplicity of the process.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A phase shifting photomask fabrication method comprising the steps of:

forming a recess in a substrate;

forming an opaque layer on the substrate and the recess;

forming a protection layer having openings on the opaque layer;

etching the opaque layer through the openings;

forming side wall spacers on each side wall of the opaque layer and the protection layer;

etching the substrate to a predetermined depth by using the side wall spacers as a mask;

removing the side wall spacers; and removing the protection layer.

2. The method of claim 1, wherein the step of forming a recess uses a substrate of a material selected from a group consisting of quartz, silicon, glass, and silicon nitride.

3. The method of claim 1, wherein the step of forming the protection layer comprises forming an inorganic photoresist layer.

4. The method of claim 1, wherein the step of forming the protection layer comprises forming an inorganic Ge—Se type photoresist layer having an Ag compound layer within the inorganic Ge—Se type photoresist layer.

5. The method of claim 1, wherein the step of forming the side wall spacers uses a polymer.

6. The method of claim 1, wherein a width of each side wall spacer corresponds to a width of a corresponding sub-opening pattern.

7. A phase shifting photomask fabrication method comprising the steps of:

forming a recess in a substrate;

forming an opaque layer on the substrate and the recess;

forming a first photoresist layer having openings;

forming side wall spacers on side walls of the first photoresist layer;

etching the opaque layer by using the side wall spacers as a mask to expose an exposed portion of the substrate;

forming a second photoresist layer on the exposed portion of the transparent substrate, the first photoresist layer, and the side wall spacers;

removing portions of the second photoresist layer not covering the exposed portion of the substrate;

removing the first photoresist layer and selected portions of the opaque layer;

etching selected portions of the transparent substrate to a depth sufficient to carry out a phase shift; and removing the side wall spacers and the second photoresist layer.

8. The method of claim 7, wherein the step of forming a recess in a substrate uses a substrate of a material selected from a group consisting of quartz, silicon, glass, and silicon nitride.

9. The method of claim 7, wherein the step of forming the first photoresist layer comprises forming an inorganic photoresist layer.

10. The method of claim 7, wherein the step of forming the first photoresist layer comprises forming an inorganic Ge—Se type photoresist layer having an Ag compound layer within the inorganic Ge—Se type photoresist layer.

11. The method of claim 7, wherein the step of forming the plurality of side wall spacers uses a polymer.

12. The method of claim 7, wherein the step of forming the second photoresist layer further comprises the steps of:

forming a negative photoresist layer over the substrate, the first photoresist layer, and the side wall spacers;

shining a light from beneath the substrate; and removing portions of the negative photoresist layer by treating the negative photoresist layer with a developing solution.

13. The method of claim 7, wherein the step of forming the second photoresist layer comprises forming a negative photoresist layer.

14. A method of forming a phase shifting photomask comprising the steps of:

forming a recess in a substrate;

depositing an opaque layer;

depositing a first photoresist layer;

patterning the first photoresist layer to form openings in the first photoresist layer;

removing portions of the opaque layer below the openings in the first photoresist layer;

depositing a second photoresist layer;

etching the second photoresist layer to form side wall spacers;

etching the substrate to a depth sufficient to generate a phase shift; and removing the side wall spacers and the second photoresist layer.

15. The method of claim 14, wherein the step of forming the recess uses substrate of a material selected from a group consisting of quartz, silicon, glass, and silicon nitride.

16. The method of claim 14, wherein the step of depositing the first photoresist layer comprises depositing an inorganic photoresist layer.

17. The method of claim 14, wherein the step of depositing the first photoresist layer comprises depositing an inorganic Ge—Se type photoresist layer having an Ag compound layer within the inorganic Ge—Se type photoresist layer.

18. The method of claim 14, wherein the step of forming side wall spacers uses a polymer.

19. The method of claim 14, wherein a width of each side wall spacer corresponds to a width of the corresponding sub-opening pattern.

20. The method of claim 14, wherein the step of depositing the opaque layer comprises depositing a chromium layer.

21. A method of forming a phase shifting photomask comprising the steps of:

forming recesses in a substrate;

depositing an opaque layer;

depositing a first photoresist layer;

forming openings in the first photoresist layer;

forming side wall spacers on side walls of the first photoresist layer;

forming openings in the opaque layer;

depositing a second photoresist layer;

removing the second photoresist layer except for portions of the second photoresist layer covering the openings in the opaque layer;

removing the first photoresist layer and selected portions of the opaque layer;

etching the substrate to form sub-opening patterns; and removing the second photoresist layer and the side wall spacers.

22. The method of claim 21, wherein the step of forming the recess uses substrate of a material selected from a group consisting of quartz, silicon, glass, and silicon nitride.

23. The method of claim 21, wherein the step of depositing the first photoresist layer comprises depositing an inorganic photoresist layer.

24. The method of claim 21, wherein the step of depositing the first photoresist layer comprises depositing an inorganic Ge—Se type photoresist layer having an Ag compound layer within the inorganic Ge—Se type photoresist layer.

25. The method of claim 21, wherein the step of forming side wall spacers uses a polymer.

26. The method of claim 21, wherein a width of each side wall spacer corresponds to a width of the corresponding sub-opening pattern.

27. The method of claim 21, wherein the step of depositing the opaque layer comprises depositing a chromium layer.

28. The method of claim 21, wherein the step of removing the first photoresist layer and selected portions of the opaque layer uses anisotropic etching.

* * * * *